US010425626B2

(12) United States Patent
Ogi et al.

(10) Patent No.: US 10,425,626 B2
(45) Date of Patent: Sep. 24, 2019

(54) LASER PROJECTION DISPLAY DEVICE AND DRIVING METHOD FOR LASER BEAM SOURCE

(71) Applicant: Hitachi-LG Data Storage, Inc., Tokyo (JP)

(72) Inventors: Yuya Ogi, Tokyo (JP); Yoshiho Seo, Tokyo (JP)

(73) Assignee: HITACHI-LG DATA STORAGE, INC., Tokyo (JP)

( * ) Notice: Subject to any disclaimer, the term of this patent is extended or adjusted under 35 U.S.C. 154(b) by 0 days.

(21) Appl. No.: 15/221,746

(22) Filed: Jul. 28, 2016

(65) Prior Publication Data
US 2017/0118452 A1 Apr. 27, 2017

(30) Foreign Application Priority Data
Oct. 21, 2015 (JP) .................................. 2015-207419

(51) Int. Cl.
*H04N 9/31* (2006.01)
*G02B 26/08* (2006.01)
*H01S 5/062* (2006.01)

(52) U.S. Cl.
CPC ....... *H04N 9/3194* (2013.01); *G02B 26/0833* (2013.01); *H04N 9/312* (2013.01);
(Continued)

(58) Field of Classification Search
CPC .... G02B 26/0833; G02B 26/10; G02B 27/18; H04N 9/3182; H04N 9/3161;
(Continued)

(56) References Cited

U.S. PATENT DOCUMENTS 5,951,891 A * 9/1999 Barenboim .......... B23K 26/032
219/121.68
2002/0180869 A1* 12/2002 Callison ............... H04N 9/3129
348/203
(Continued)

FOREIGN PATENT DOCUMENTS

| JP | 2003-085845 A | 3/2003 |
| JP | 2006-343397 A | 12/2006 |
| JP | 2011-039324 A | 2/2011 |

OTHER PUBLICATIONS

The Extended European Search Report dated Mar. 3, 2017 for the EP Application No. 16180017.2.

*Primary Examiner* — Paulos M Natnael
*Assistant Examiner* — Sean N. Haiem
(74) *Attorney, Agent, or Firm* — Volpe and Koenig, P.C.

(57) ABSTRACT

The laser projection display device (1) includes a laser beam source (5), a laser driver (4) driving the laser beam source, and an image processing unit (2) supplying a display image signal to the laser driver. The image processing unit applies a preliminary emission signal (53) to perform preliminary emission to an image signal (50) in a predetermined period (t0 to t1) immediately before a black pixel signal is switched to a signal except for the black pixel signal when the image signal has a black pixel duration. In particular, the preliminary emission process is performed when the laser beam source is operated in a dark image region while being reduced in maximum light intensity, and, as the preliminary emission signal, a signal (L0) corresponding to a light intensity which is $\frac{1}{10}$ or less a maximum light intensity (La) in the dark image region.

9 Claims, 11 Drawing Sheets

(52) U.S. Cl.
CPC ......... *H04N 9/3108* (2013.01); *H04N 9/3135* (2013.01); *H04N 9/3155* (2013.01); *H04N 9/3161* (2013.01); *H04N 9/3182* (2013.01); *H01S 5/06213* (2013.01)

(58) Field of Classification Search
CPC .... H04N 9/3155; H04N 9/312; H04N 9/3108; H04N 9/3194; H04N 9/3135; G03B 21/00
USPC ................. 345/214; 219/121.68; 250/205
See application file for complete search history.

(56) References Cited

U.S. PATENT DOCUMENTS

| | | | |
|---|---|---|---|
| 2006/0221021 A1* | 10/2006 | Hajjar | G03B 21/567 345/84 |
| 2009/0096776 A1* | 4/2009 | Han | G09G 3/3413 345/213 |
| 2009/0096779 A1* | 4/2009 | Ikegami | G09G 3/02 345/214 |
| 2009/0160833 A1* | 6/2009 | Brown | G09G 3/02 345/207 |
| 2009/0224136 A1* | 9/2009 | Ikegami | G01J 1/32 250/205 |

* cited by examiner

F I G. 1
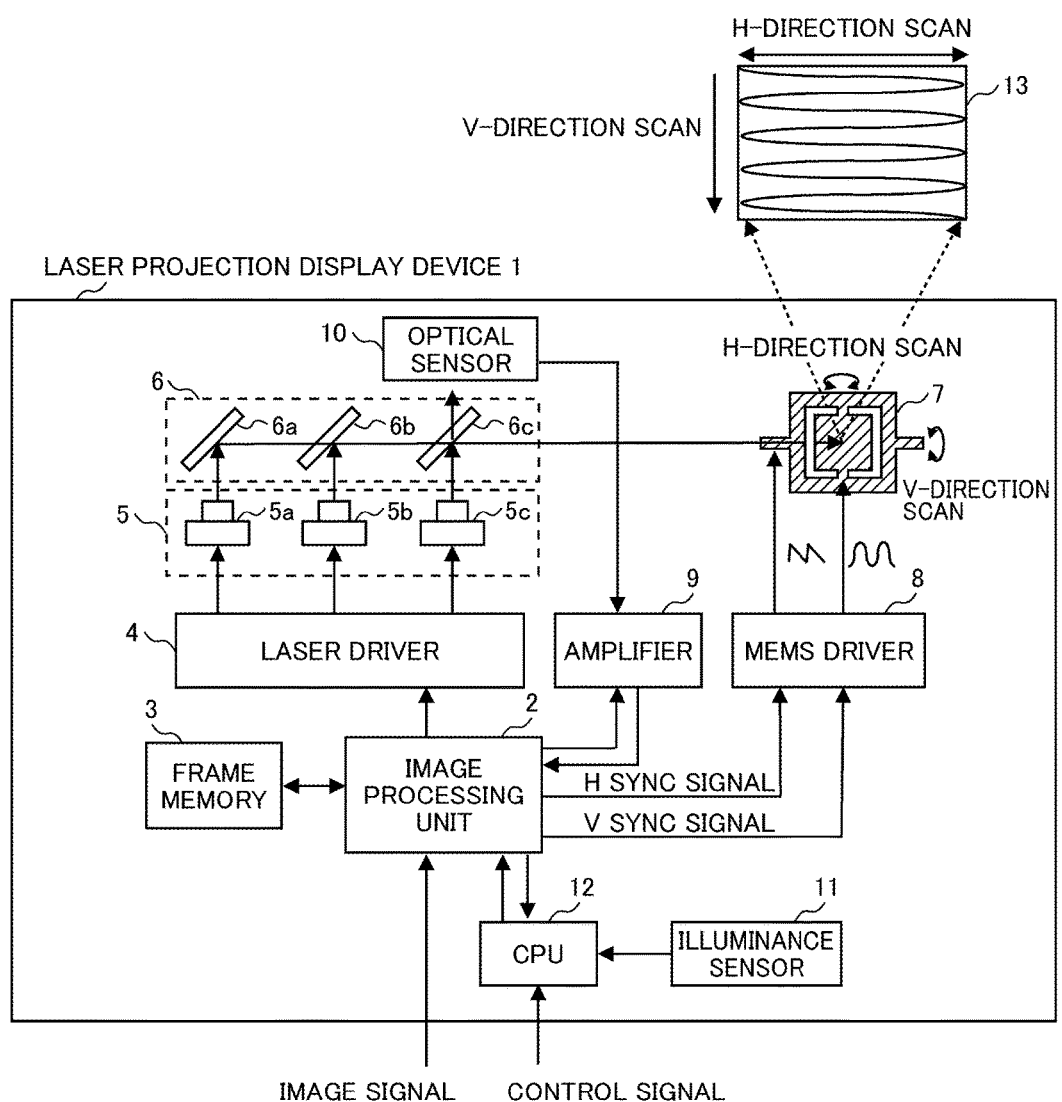

F I G. 4 A
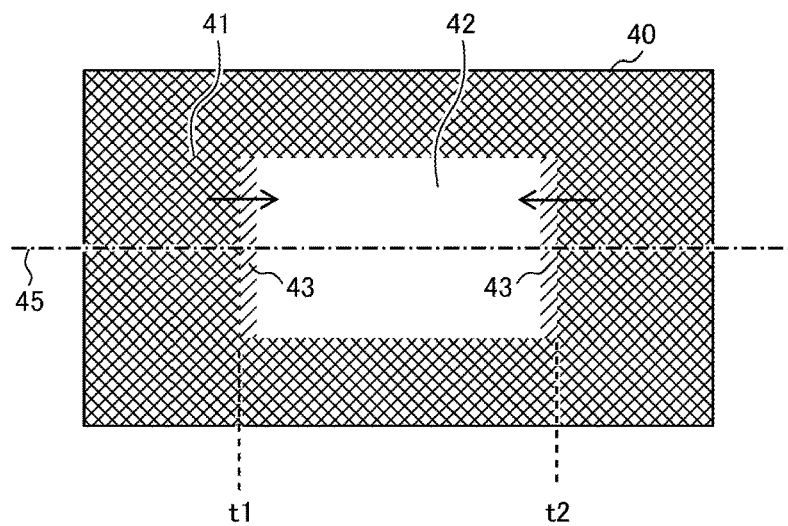
F I G. 4 B
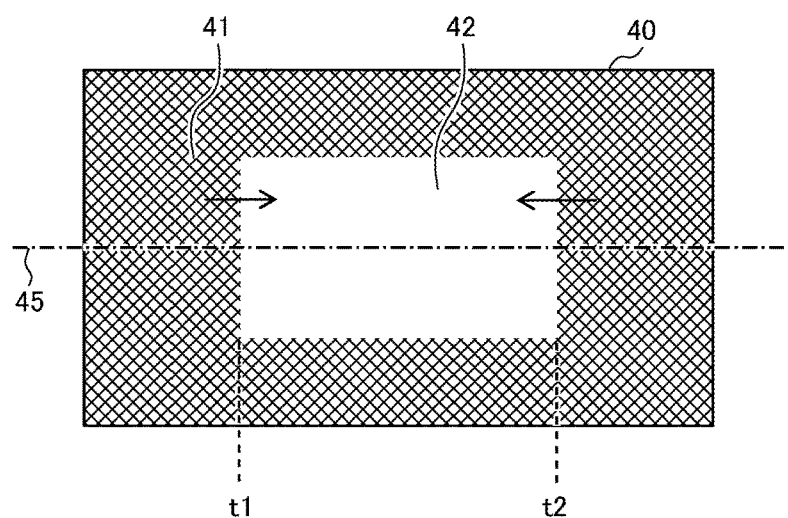

F I G. 9
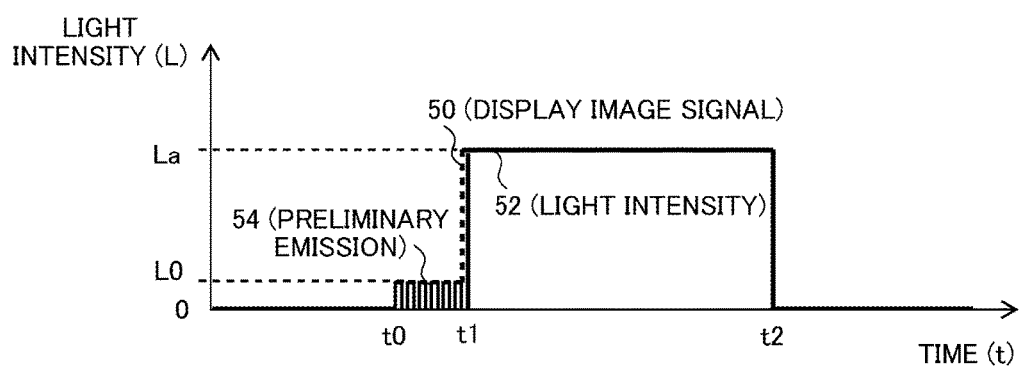

F I G. 1 1 A
MONITOR EMISSION
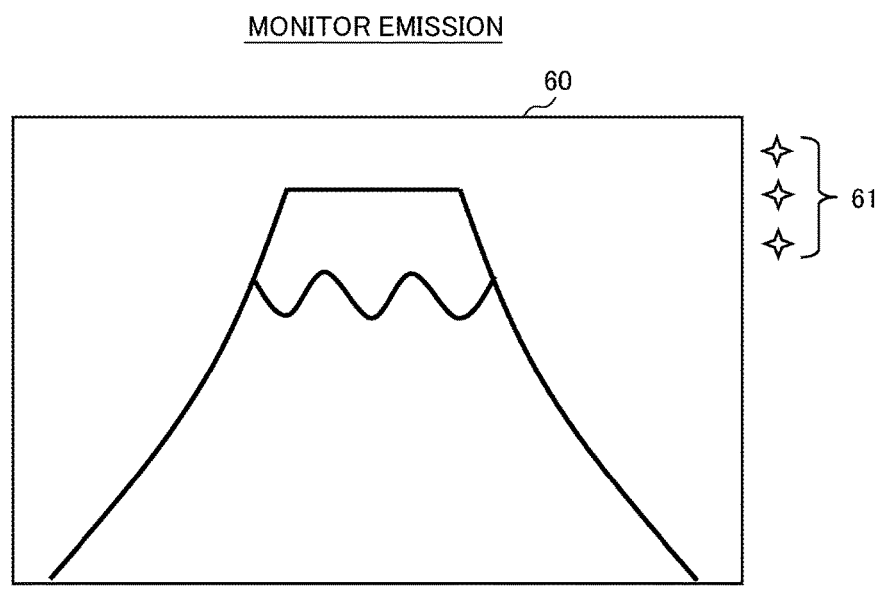
F I G. 1 1 B
APPLY PRELIMINARY EMISSION
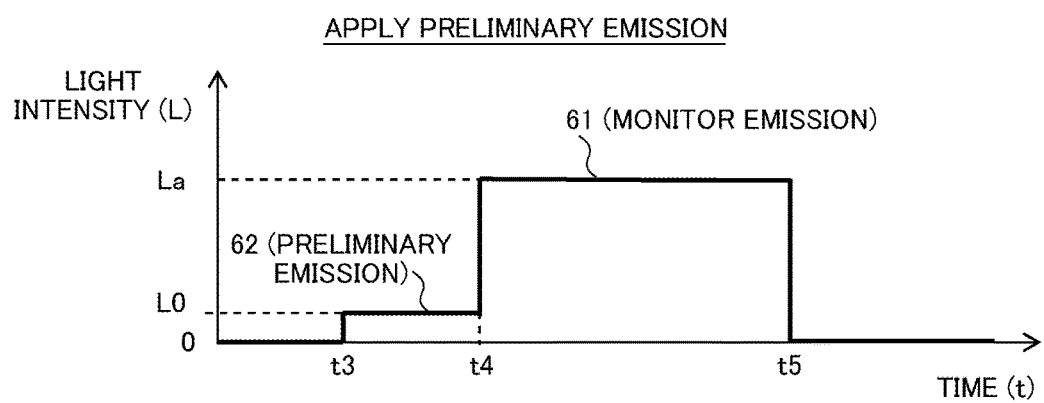

LASER PROJECTION DISPLAY DEVICE AND DRIVING METHOD FOR LASER BEAM SOURCE

CLAIM OF PRIORITY

The present application claims priority from Japanese patent application serial No. JP 2015-207419, filed on Oct. 21, 2015, the content of which is hereby incorporated by reference into this application.

BACKGROUND OF THE INVENTION (1) Field of the Invention

The present invention relates to a laser projection display device that scans a laser beam from a semiconductor laser with a two-dimensional scanning mirror or the like to display an image and a driving method for a laser beam source used therein.

(2) Description of the Related Art

In recent years, a laser projection display device which projects an image with a semiconductor laser, a MEMS (Micro Electro Mechanical Systems) mirror, and the like has been made practicable. This laser projection display device is used as, for example, a head-up display for driving support for an automobile. In the laser projection display device, a two-dimensional scanning mirror horizontally and vertically scans, and, at the same time, a laser beam source is modulated to display a desired image on a projection surface.

For example, Japanese Unexamined Patent Publication No. 2006-343397 (Patent Literature 1) describes a configuration in which, in an image projection device which raster-scans a laser beam to project an image on a screen, the emission intensity of a laser beam is adjusted in accordance with a change in horizontal raster scanning speed such that the brightness of a projection image displayed on the screen becomes uniform.

Japanese Unexamined Patent Publication No. 2003-85845 (Patent Literature 2) includes, as a problem to be solved, a phenomenon in which, in a pulse drive magnetic modulation overwrite type magneto optical recording/reproducing device, when a laser beam source is driven with a rectangular pulse, a laser emission waveform is overshot and vibrated at a rising edge of each pulse. Patent Literature 2 describes, as a countermeasure against the problem, a configuration in which a laser beam is preliminarily emitted before the emission intensity of the laser beam is increased to a recording power level as long as the laser beam does not influence a recording film of a recording medium although the laser beam is emitted.

SUMMARY OF THE INVENTION

The present inventor has discovered a phenomenon in which, when the luminance of an image signal increases step by step in a region in which a laser beam has a small light intensity, rising edge response of the laser beam is deteriorated. This phenomenon will be described with reference to the accompanying drawings.

FIG. 4A shows an example of an image 40 displayed on a projection surface and a case in which the central portion of a black background 41 has a white window 42. On left and right ends (bright/dark state switching portions) of the white window 42, a portion 43 having a luminance lower than that of an original white color is generated. According to an examination by the present inventor, this phenomenon, as shown in FIG. 5A, is estimated to be caused by a blunted emission waveform formed by deterioration in rising characteristic of a drive current for a laser driver. In particular, it is found that the phenomenon occurs when a laser beam source is operated at a value approximate to a threshold value of the laser beam source. Details of the examination result will be described later.

Patent Literatures 1 and 2 described above do not consider deterioration in rising response of a laser beam shown in FIG. 4A or 5A. The technique described in Patent Literature 2 is also related to a rising characteristic in pulse emission. However, the technique suppresses a vibration phenomenon (ringing) caused by overshoot, and is different from the phenomenon shown in FIG. 4A or 5A.

The present invention has been made in consideration of the problem, and has as its object to provide a laser projection display device which can improve rising response of a laser beam and eliminate image quality deterioration at a bright/dark state switching portion of an image to make it possible to display a high-quality image.

In order to solve the problem, according to the present invention, there is provided a laser projection display device which projects a laser beam depending on an image signal to display an image, including a laser beam source generating the laser beam, a laser beam source driving unit driving the laser beam source, and an image processing unit supplying an image signal for display to the laser beam source driving unit, wherein the image processing unit, when the image signal has a black pixel duration, in a predetermined period immediately before a black pixel signal is switched to a signal except for the black pixel signal, performs a preliminary emission process applying a preliminary emission signal to perform preliminary emission to the image signal.

According to the present invention, there is provided a driving method for a laser beam source when a laser beam depending on an image signal is projected to display an image including the step of determining whether the image signal has a black pixel duration, the step of, when the image signal has the black pixel duration, in a predetermined period immediately before a black pixel signal is switched to a signal except for the black pixel signal, applying a preliminary emission signal to perform preliminary emission to the image signal, and the step of supplying the image signal to which the preliminary emission signal is applied to a laser beam source driving unit, driving the laser beam source with the laser beam driving unit, and generating a laser beam depending on the image signal.

According to the present invention, there can be provided a laser projection display device which can suppress a decrease in luminance and irregular color at an image bright/dark state switching portion and can display a high-quality image.

BRIEF DESCRIPTION OF THE DRAWINGS

FIG. 1 is a block diagram showing a basic configuration of a laser projection display device according to a first embodiment.

FIGS. 4A and 4B are diagrams showing an example of an image displayed in a bright image region.

FIG. 9 is a diagram showing an emission waveform of a semiconductor laser when preliminary emission is added in a second embodiment.

FIGS. 11A and 11B are diagrams showing monitor emission in a third embodiment and preliminary emission applied to the monitor emission.

DETAILED DESCRIPTION OF THE EMBODIMENT

Figure 2:
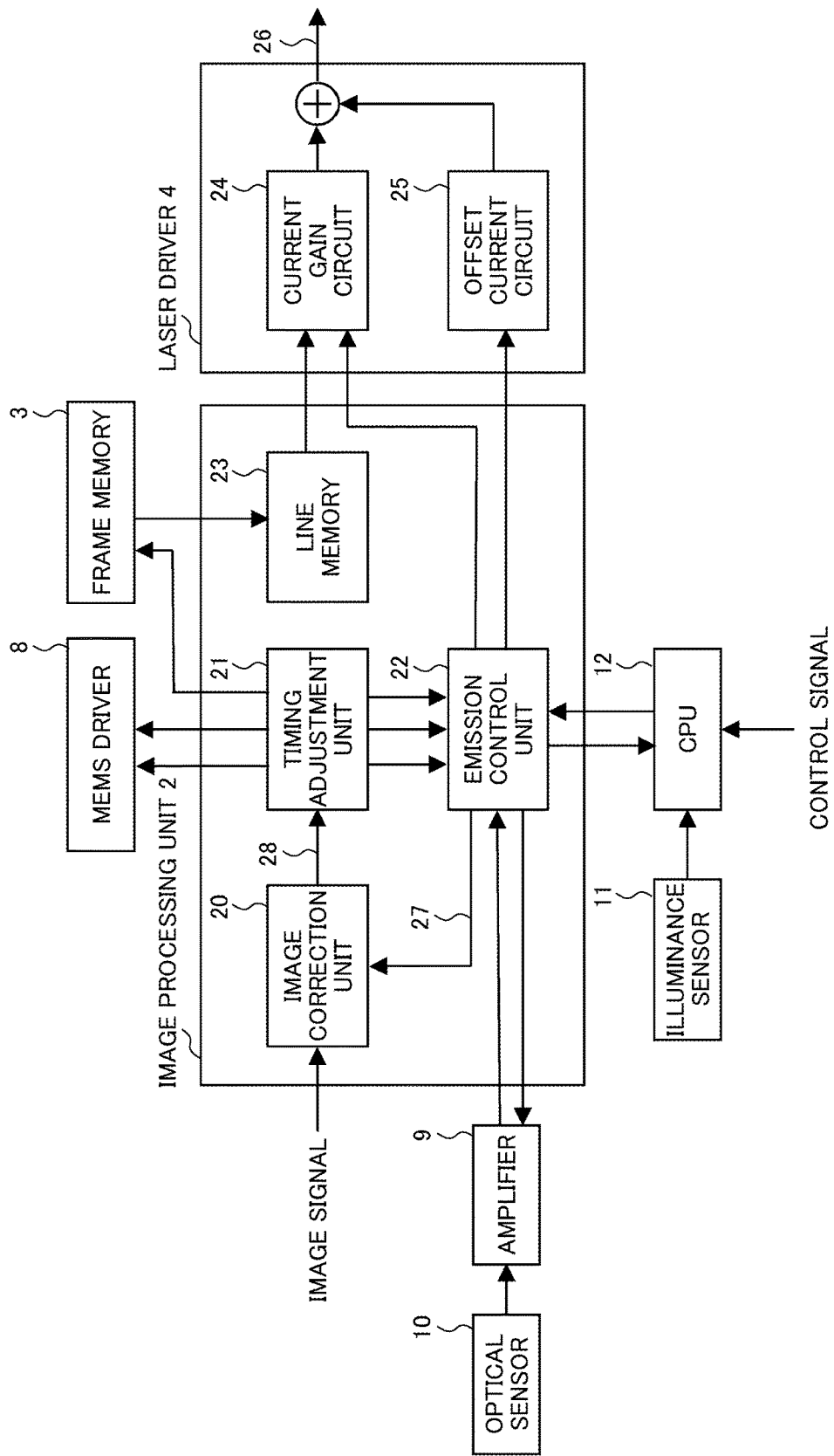
FIG. 2 is a diagram showing the internal configurations of an image processing unit and a laser driver.

Embodiments of the present invention will be described below with reference to the accompanying drawings. The following description is to explain an embodiment of the present invention, and does not limit the scope of the invention. Thus, a person skilled in the art can employ embodiments obtained by replacing some elements or all elements of the embodiment with elements equivalent thereto. The embodiments are included in the scope of the invention.

First Embodiment

FIG. 1 is a block diagram showing a basic configuration of a laser projection display device according to a first embodiment. A laser projection display device 1 includes an image processing unit 2, a frame memory 3, a laser driver (laser beam source driving unit) 4, a laser beam source 5, a reflection mirror 6, a MEMS (Micro Electro Mechanical Systems) scanning mirror 7, a MEMS driver 8, an amplifier 9, an optical sensor 10, an illuminance sensor 11, and a CPU (Central Processing Unit) 12, and displays a display image 13 on a projection surface. Operations of these units will be described below.

The image processing unit 2 generates a projection image signal obtained by performing various corrections to an externally input image signal, generates a horizontal sync (H sync) signal and a vertical sync (V sync) signal synchronized with the image signal, and supplies the resultant signal to the MEMS driver 8. The various corrections performed in the image processing unit 2 include a correction for image distortion caused by scanning performed by the MEMS scanning mirror 7, grayscale adjustment of an image performed by a lookup table (LUT), and the like. The image distortion is caused by different relative angles between the laser projection display device 1 and the projection surface, optical axis misalignment between the laser beam source 5 and the MEMS scanning mirror 7, and the like. The generated image signal is temporarily stored in the frame memory 3, read in response to a read signal synchronized with the horizontal sync signal and the vertical sync signal, and supplied to the laser driver 4.

The image processing unit 2 also performs a preliminary emission process. The preliminary emission process is a process of embedding a preliminary-emission image signal such that a current having a predetermined current value flows in the laser beam source 5 in a predetermined period of the image signal to improve the rising characteristic of the laser beam. In order to set a period to perform the preliminary emission process, a black pixel determination process is also performed to an image signal to be input. The details of these processes will be described later.

The laser driver 4 receives an image signal (including a signal for preliminary emission) output from the image processing unit 2 and modulates a drive current of the laser beam source 5 according to the image signal. The laser beam source 5 includes three semiconductor lasers 5a, 5b, and 5c for three colors (R, G, and B), and emits RGB laser beams corresponding to the image signal in units of the R, G, and B colors.

The three RGB laser beams are synthesized with each other by the reflection mirror 6 and irradiated on the MEMS scanning mirror 7. The reflection mirror 6 includes dichroic mirrors 6a, 6b, and 6c which reflect a beam having a specific wavelength and transmits beams having wavelengths except for the specific wavelength, synthesizes the RGB laser beams into one laser beam, and supplies the laser beam to the scanning mirror 7.

The MEMS scanning mirror 7 is an image scanning unit having a two-axis rotating mechanism which vibrates a central mirror unit in two directions, i.e., a horizontal direction (H direction) and a vertical direction (V direction). The MEMS driver 8 generates a sine wave in synchronization with the horizontal sync signal from the image processing unit 2 and generates a saw-tooth wave synchronized with the vertical sync signal to control the drive of the MEMS scanning mirror 7. In this manner, the laser beam is scanned along a track as shown in the display image 13 in FIG. 1. The scanning is synchronized with a modulation operation by the laser driver 4 to make it possible to two-dimensionally display the input image on the projection surface.

The optical sensor 10 detects the intensity of a laser beam emitted from the laser beam source 5. More specifically, the optical sensor 10 detects leaked beam (reflected beam and transmitted beam) corresponding to several percent of the laser beam from the reflection mirror 6c and outputs the beam to the amplifier 9. The amplifier 9 amplifies the output from the optical sensor 10 according to a gain set by the image processing unit 2 and then outputs the amplified output to the image processing unit 2. The image processing unit 2 compares the detection output of the optical sensor 10 with the luminance level of the input image signal and controls the laser driver 4 to make the level of the detection output equal to a predetermined level.

The illuminance sensor 11 detects an illuminance at a periphery of the laser projection display device 1 to output the illuminance to the CPU 12. The CPU 12 receives a signal from the illuminance sensor 11 or an external control signal and supplies a dimmer control request signal to control the brightness of the display image 13 to be generated to the image processing unit 2.

FIG. 2 is a diagram showing the internal configurations of the image processing unit 2 and the laser driver 4. An externally input image signal is input to an image correction unit 20 disposed in the image processing unit 2.

The image correction unit 20 performs correction for image distortion caused by scanning of the MEMS scanning mirror 7, grayscale adjustment of an image performed by an LUT, and a preliminary emission process on the basis of a preliminary emission control signal 27 from the emission control unit 22. The preliminary emission control signal 27 includes a determination threshold value to determine whether the preliminary emission process is performed. In this manner, the image correction unit 20 performs the image adjustment and the preliminary emission process to the externally input image signal and sends a corrected image signal 28 to a timing adjustment unit 21.

The timing adjustment unit 21 generates a horizontal sync signal and a vertical sync signal from the corrected image signal 28 input from the image correction unit 20 and sends the horizontal sync signal and the vertical sync signal to the MEMS driver 8 and the emission control signal 22. The image signal 28 is temporarily stored in the frame memory 3. The image signal stored in the frame memory 3 is read in response to a read signal being in synchronization with the horizontal sync signal and the vertical sync signal generated by the timing adjustment unit 21. The image signal in the frame memory 3 is read such that the image signal is delayed by 1 frame with reference to the input image signal.

The read image signal is input to a line memory 23. The line memory 23 takes an image signal in one horizontal period, sequentially reads image signals in the next horizontal period, and supplies the image signals to the laser driver 4. The image signal is temporarily relayed by the line memory 23 to match the times with each other when a read clock frequency of the frame memory 3 and a transmission clock frequency at which the image signal is transmitted to the laser driver 4 are different from each other. When both the clock frequencies are matched with each other, the line memory 23 is unnecessary.

The emission control unit 22, on the basis of an optical output detected by the optical sensor 10 and amplified by the amplifier 9, controls a current gain circuit 24 and an offset current circuit 25 in the laser driver 4. In this manner, the emission control unit 22 has a function of correcting the brightness and the white balance of a projection image with respect to lack of intensity of a laser beam caused by aged deterioration, a variation in laser beam output caused by a change in temperature of an ambient surrounding, and the like. The emission control unit 22 sends the preliminary emission control signal 27 to the image correction unit 20.

The current gain circuit 24 and the offset current circuit 25 in the laser driver 4 will be described below. The current gain circuit 24 multiplies an image signal value input from the line memory 23 by a current gain to control values of currents flowing in the semiconductor lasers 5a to 5c. The current gain is set with the emission control unit 22. The offset current circuit 25 adjusts an offset current to determine a lower limit value at which the semiconductor lasers 5a to 5c emit beams depending on the offset current value set with the emission control unit 22. Thus, each current 26 actually flowing in the semiconductor lasers 5a to 5c is a sum of a multiplied current value of the image signal and the current gain calculated by the current gain circuit 24 and the offset current value set with the offset current circuit 25.

Figure 3:
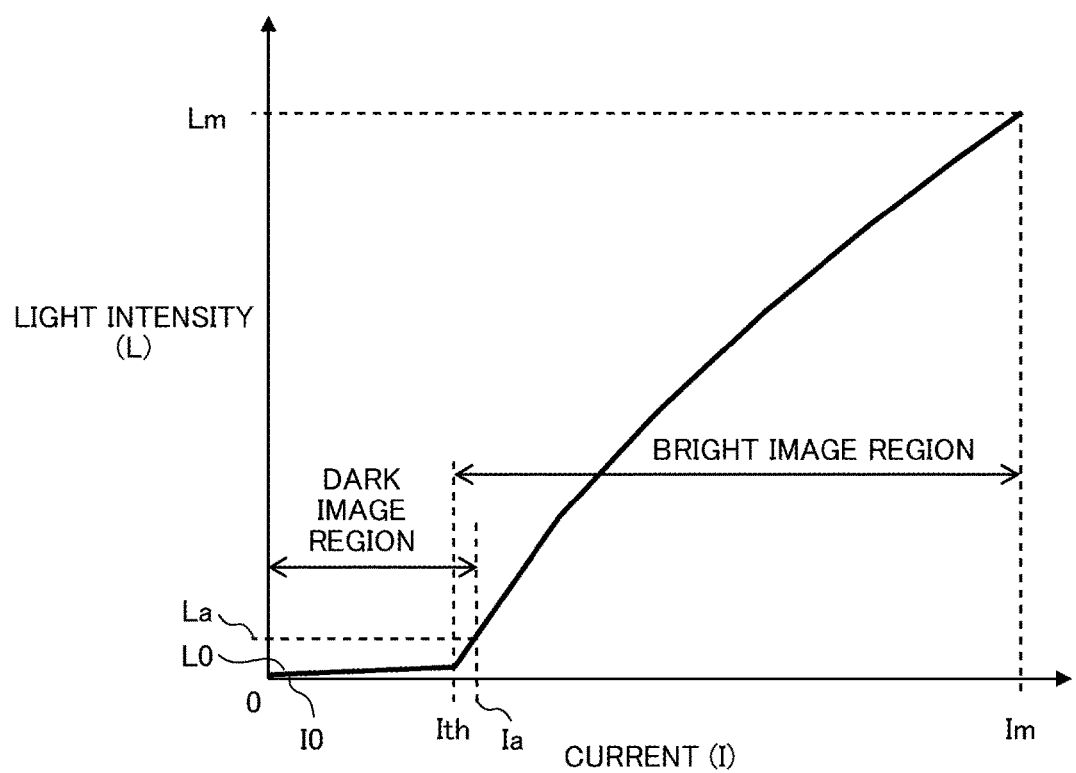
FIG. 3 is a diagram showing an example of a light intensity-forward current characteristic of a semiconductor laser.

FIG. 3 is a diagram showing an example of a light intensity-forward current characteristic of a semiconductor laser. An ordinary semiconductor laser has a characteristic in which a light intensity L sharply increases at the moment of a certain threshold current Ith. A change in light intensity is not constant with respect to a current I and has a nonlinear characteristic.

Display of a bright image will be described first. For example, when the laser projection display device 1 is used as an in-vehicle display device (head-up display), a bright image is preferably displayed by using a high light intensity at which the laser projection display device can project an image in a bright environment in daylight.

Thus, as a current range used when a bright image is displayed, a range of the threshold current Ith to a current Im at which a maximum light intensity Lm can be obtained (to be referred to as a bright image region hereinafter) is set. More specifically, when the image signal is expressed with 8 bits (255 grayscales at the maximum), the current gain circuit 24 and the offset current circuit 25 are controlled such that a forward current is the threshold current Ith when the image signal (grayscale value) is 0 or 1 and a maximum forward current Im is obtained when the image signal (grayscale value) is 255. More specifically, the emission control unit 22 causes the current gain circuit 24 to set the current gain to (Im−Ith)/255 and causes the offset current circuit 25 to set the offset current value to Ith. When the values are set as described above, the current having the value Ith can be caused to flow in the semiconductor laser when the image signal is 0, and the current having the value Im can be caused to flow in the semiconductor laser when the image signal is 255. When the image signal is 0, the current gain circuit 24 and the offset current circuit 25 may be controlled such that the laser is turned off by setting the current to 0 to obtain contrast.

The laser projection display device 1 used when a dark image is displayed will be described below. For example, when the laser projection display device 1 is used as an in-vehicle display device, in an environment in which the surrounding of a vehicle is dark as in nighttime driving or driving inside a tunnel, an image displayed at a brightness corresponding to the maximum light intensity Lm dazzles the driver. Thus, the laser projection display device 1 must display the image after the image is switched to a dark image.

Thus, a range including the threshold current Ith is used as a current range used when a dark image is formed, and is defined as a range (to be referred to as a dark image region hereinafter) from zero current to a current Ia at which the light intensity La can be obtained. Although the light intensity La is the maximum light intensity in the dark image region, the light intensity La is made sufficiently lower than the maximum light intensity Lm in the bright image region. For this reason, the emission control unit 22 sets a current gain to Ia/255 for the current gain circuit 24 and sets the offset current value to 0 for the offset current circuit 25. With these settings, no current flows in the semiconductor laser when the image signal is 0, and a current is caused to flow in the semiconductor laser when the image signal is 255, so that the brightness of the display image can be changed depending on the image signal within the range of the dark image region.

FIG. 3 shows a light intensity L0 used in preliminary emission (will be described later) and a current I0 caused to flow for the light intensity L0. The light intensity L0 is at a level which is 1/10 or less the light intensity La.

Deterioration in rising response of a laser beam in the dark image region and improvement achieved by the embodiment will be described below with reference to FIGS. 4 to 6. A problem in a conventional method will be described first.

FIG. 4A is a diagram showing an example of an image displayed in the black image region. An image 40 to be displayed is a pattern in which a white window 42 of the image signal 255 is disposed on a black background 41 of the image signal 0. The size of the white window 42 is 50% of the side of the entire screen in horizontal and vertical directions. In this case, the examination by the present inventor has made it clear that portions 43 having luminances lower than those of the original white color are generated at the horizontal ends of the white window 42 of the image. The present inventor has examined a relationship between the phenomenon and the rising response of the laser beam.

Figure 5A:
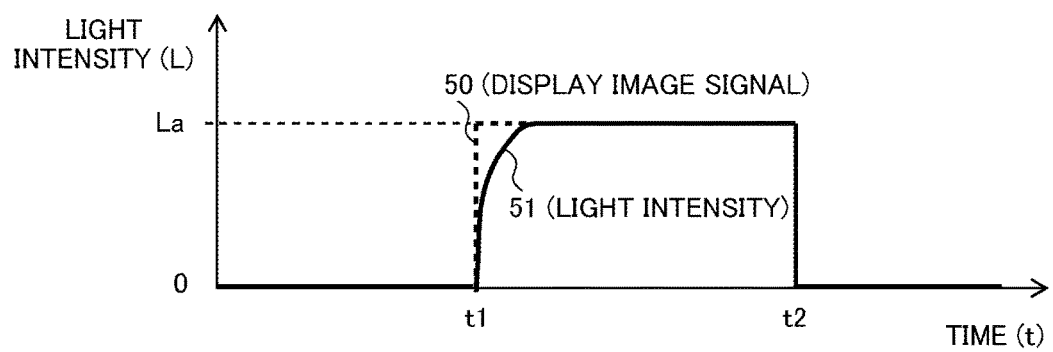
FIGS. 5A and 5B are diagrams showing an emission waveform of a semiconductor laser.

FIG. 5A is a diagram showing an emission waveform of a semiconductor laser, and is obtained when a position indicated by a chain line 45 in FIG. 4A is scanned from the left to the right. Time t1 and time t2 correspond to times at which both the ends of the white window 42 are scanned. In order to drive the laser in the dark image region, the light intensity L of the laser beam changes between the minimum value 0 and the maximum value La. When a rectangular display image signal 50 indicated by a broken line is given, the light intensity should be essentially switched to La at time t1. However, a rising response waveform 51 of the laser beam cannot follow the change, and waveform blunting occurs. It is considered that waveform blunting generates a portion 43 the luminance of which is lower than that of the original white color due to lack of light intensity in a rising time. The waveform blunting is a phenomenon observed in a rising time of a laser beam, and does not occur in a fall time.

The laser beam is reciprocally horizontally scanned in the image shown in FIG. 4A, time t1 and time t2 are exchanged with each other when the operation is left-pointing, and the portion 43 the luminance is lowered is generated at the right end of the white window 42 as described above.

Figure 6A:
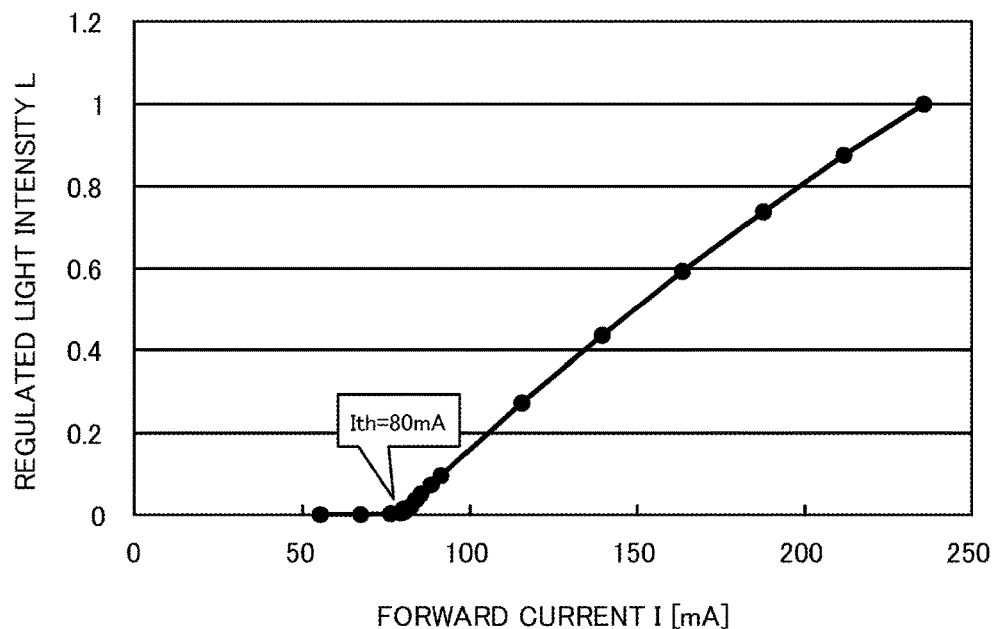
FIGS. 6A and 6B are diagrams showing results obtained by exact measurement of rising response of a semiconductor laser.
Figure 6B:
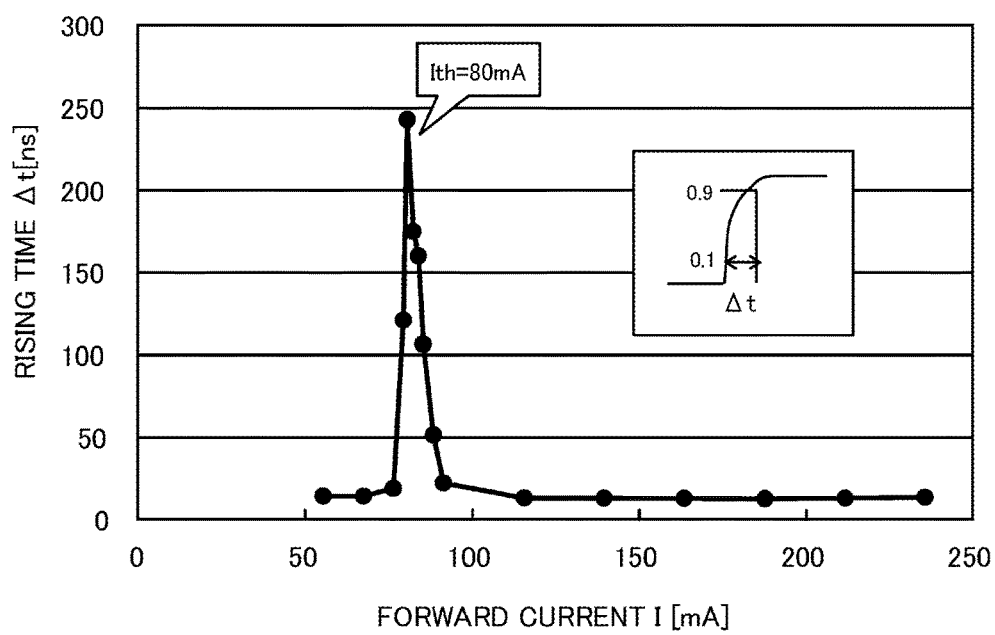

FIGS. 6A and 6B show results obtained by measuring details of rising response of the semiconductor laser. FIG. 6A shows a light intensity-forward current characteristic, and FIG. 6B shows a rising time-forward current characteristic of a laser beam. As a rising time Δt, time required to change a target intensity from 10% to 90% was measured. As is apparent from the result, the rising time Δt of the laser beam at a value approximate to the threshold current Ith (in this case, 80 mA). For this reason, the rising waveform of the laser beam is blunted to cause the luminance of the ends of the white window to be lowered as indicated by reference numeral 43 in FIG. 4A. Since the characteristics of the semiconductor lasers of the RGB colors are not even, irregular color occurs at the ends of the white window when a white color is displayed to cause deterioration in image quality. In this manner, it is true that the deterioration in rising response is a unique phenomenon occurring at a value approximate to the threshold current Ith, i.e., when a laser is emitted in the dark image region.

As a countermeasure against this, in the embodiment, a preliminary emission process adding preliminary emission in a predetermined period immediately before rising time of laser emission is introduced.

FIG. 4B is a diagram showing an example of an image displayed when the preliminary emission is added. In FIG. 4B, the same image pattern as in FIG. 4A is displayed. However, a portion the luminance of which is lowered cannot be observed at the left and right ends of the white window 42.

Figure 5B:
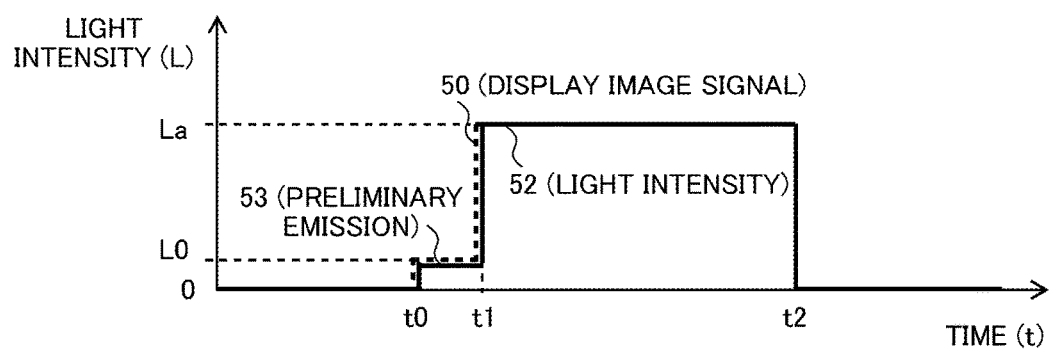

FIG. 5B is a diagram showing an emission waveform of a semiconductor laser when preliminary emission is added. For a period from time t0 to time 1t immediately before a rising time, preliminary emission 53 of the light intensity L0 is added. As a result, in the laser beam response time 52, the light intensity sharply rises at time t1. The light intensity L0 is desirably 1/10 the maximum light intensity La in the dark image region. A period (t0 to t1) in which the preliminary emission is added is desirably approximately 600 ns or less. This is because, when the light intensity L0 of the preliminary emission or an application time thereof is excessively high or long, a blight line generated by the preliminary emission is easily visually recognized. When the preliminary emission is added, rising response of a laser beam can be improved, and a decrease in luminance and irregular color of the image bright/dark state switching portion (end portions of the white window) can be suppressed.

A cause of deterioration of the rising response of the laser beam described above and a reason why the rising response is improved by the preliminary emission process described above will be considered here. The laser driver 4 includes a switch element built therein, and the switch element controls currents flowing in the semiconductor lasers 5*a* to 5*c*. However, since the switch element has a parasitic capacitance, a current of, for example, 100 mA is tried to be caused to flow in the semiconductor laser when any current does not flow in the semiconductor laser, the current increases with a certain time constant and finally reaches 100 mA. More specifically, the current cannot instantaneously reach 100 mA. Furthermore, due to the nonlinear emission characteristics of the semiconductor laser shown in FIG. 3 or FIGS. 6A and 6B, when a current is increased in a region approximate to, especially, the threshold current Ith, the change of the light intensity is dulled. As a result, the light intensity obtained at time t1 in FIG. 5A does not reach La, and an optical output response waveform indicated by reference numeral 51 is estimated to be obtained.

In contrast to this, in the embodiment, the preliminary emission 53 is added, i.e., a slight current is caused to flow in the semiconductor laser through the laser driver 4. As a result, the influence of the parasitic capacitance of the switch element decreases, and a time constant in application of the current decreases. As shown in FIG. 5B, rising response of a laser beam in a dark image region can be improved.

According to the embodiment, in order to perform the preliminary emission, a black pixel determination process of detecting a duration of a black pixel in which a current flowing in the semiconductor laser with respect to an image signal to be displayed comes close to 0 and a preliminary emission process of adding preliminary emission on the basis of the black pixel determination process are introduced. Procedures for the processes will be described below.

Figure 7:
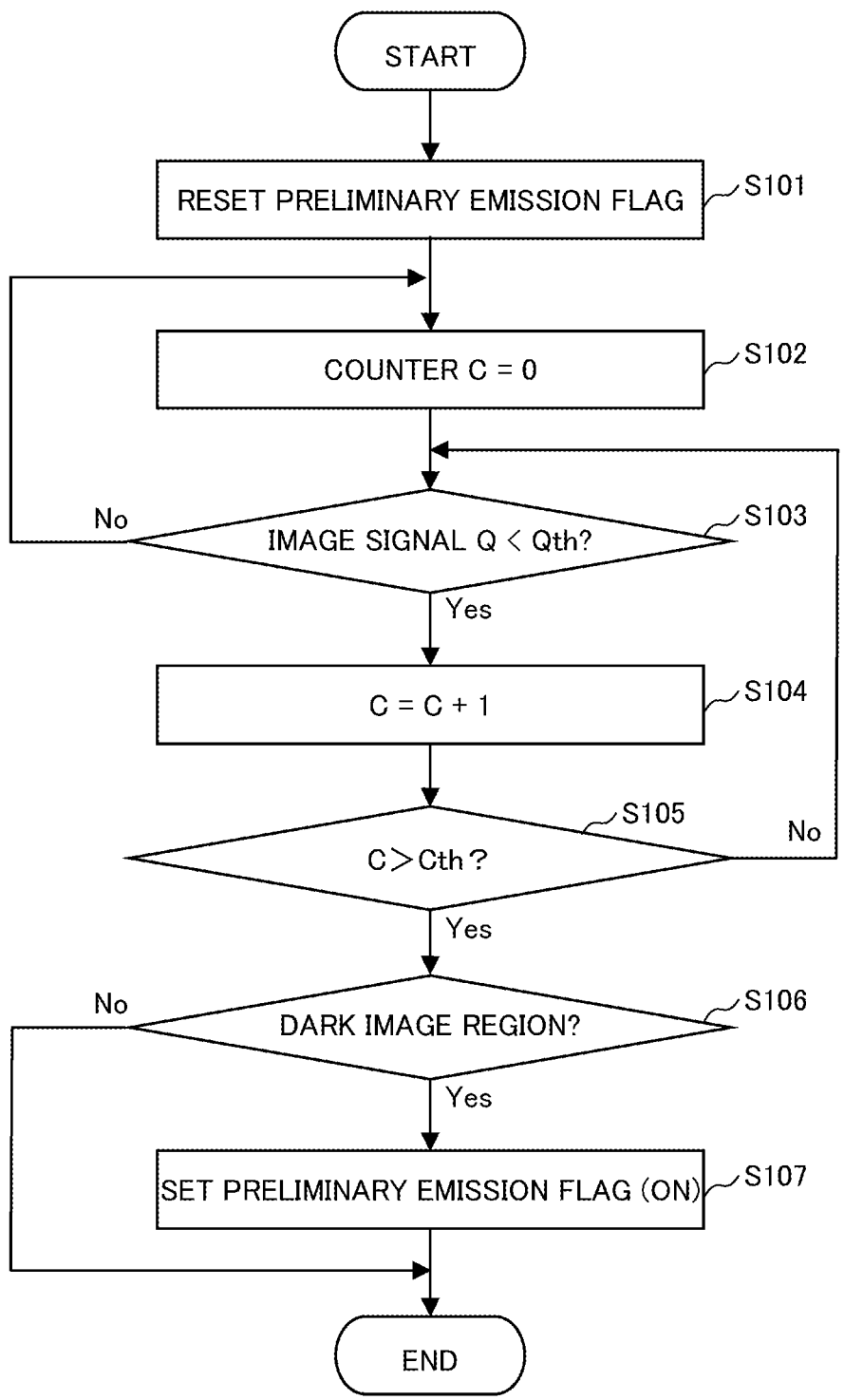
FIG. 7 is a flow chart showing a black pixel determination process (S100).

FIG. 7 is a flow chart showing the black pixel determination process (S100). The image correction unit 20 in the image processing unit 2 is a process of determining whether the image signal includes a black pixel and setting a "preliminary emission flag" representing that preliminary emission is necessary when the black pixel continues for a predetermined period.

This flow is started each time the preliminary emission flag is reset (S101). After the preliminary emission flag is reset, the image correction unit 20 resets a counter C to make the number zero (0) (S102). The counter C is a counter to measure a black pixel duration. The counter C measures the black pixel duration in units of pixels. After the counter C is reset, an image signal value Q at a current pixel is compared with a threshold value Qth (S103). In this case, the threshold value Qth is a black pixel determination threshold value given as the preliminary emission control signal 27 by the emission control unit 22, and an image signal having a value smaller than the threshold value Qth is determined as a black pixel. Although the threshold value Qth is desirably about 1 to 3 as an 8-bit grayscale value, the value is determined according to the specifications of the display unit.

When the image signal value is smaller than the threshold value Qth (Yes), the image correction unit 20 increments the counter C (S104) to shift to S105. When the image signal value Q is larger than the threshold value Qth (No), the image correction unit 20 shifts to S102, and the image correction unit 20 resets the counter C. Thereafter, the image correction unit 20 compares the image signal value Q of the next pixel with the threshold value Qth (S103).

In S105, the image correction unit 20 compares the value of the counter C with a threshold value Cth. In this case, the threshold value Cth is a black pixel duration threshold value given as the preliminary emission control signal 27 by the emission control unit 22. The threshold value Cth is equivalent to several percent of the full scanning width in the horizontal direction. When the value of the counter C is smaller than the threshold value Cth (No), the image correction unit 20 returns to S103 to keep the value of the counter C, and the image signal value Q of the next pixel is compared with the threshold value Qth. When the value of the counter C is larger than the threshold value Cth (Yes), the image correction unit 20 shifts to S106.

In S106, it is determined whether a current range to be used is a dark image region. As shown in FIG. 3 and FIGS. 6A and 6B, since rising response of a laser beam is deteriorated at a current approximate to the threshold current Ith, preliminary emission is performed only when the current range is the dark image region. As a result of the determination, when the current region is determined as the dark image region (Yes), the preliminary emission flag is set to ON (S107). When the current range is the dark image region (No), the preliminary emission flag is not set. The black pixel determination process (S100) sets the preliminary emission flag to ON in a section in which a pixel of an image signal having a value smaller than the threshold value Qth continues for a time longer than the threshold value Cth.

Figure 8:
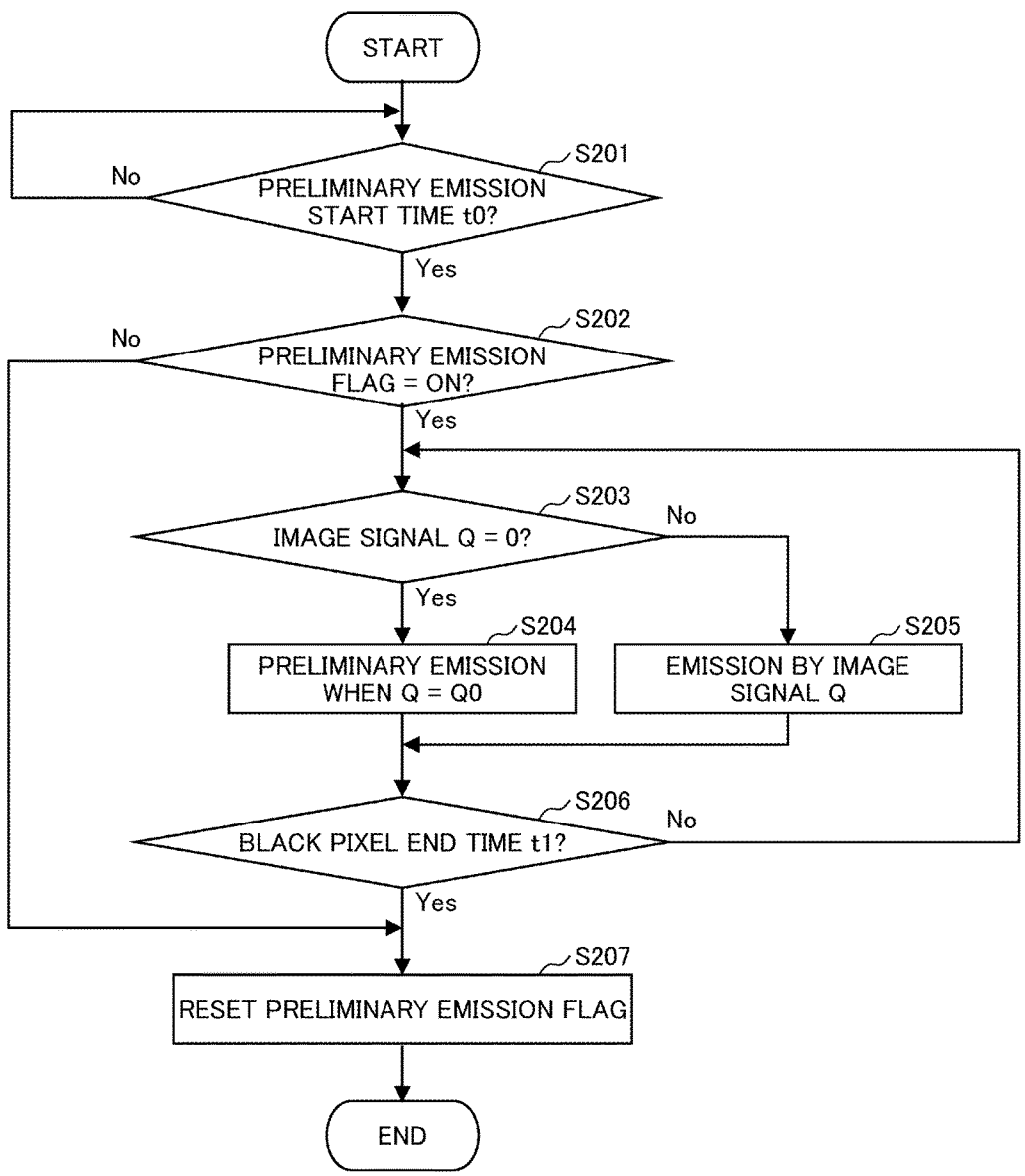
FIG. 8 is a flow chart showing a preliminary emission process (S200).

FIG. 8 is a flow chart showing a preliminary emission process (S200). In response to a result of the black pixel determination process in FIG. 7, the image correction unit 20 performs a process of generating an image signal for preliminary emission.

The preliminary emission is applied in a period from time t0 to time t1 in FIG. 5B, start time t0 is time a predetermined time (for example, 600 ns or less) before the time t1. In this case, the time t1 is time (black pixel end time) at which the black pixel period is over to switch the pixel to a pixel except for a black pixel, and has been known by the black pixel determination process in FIG. 7. A method of calculating the time t0 from the time t1 can be easily achieved by a method of delaying the time t1 by using a pipeline process or the like using a shift register or a method of detecting the time t0 in advance by using a line buffer.

In S201, the image correction unit 20 confirms that the current time reaches preliminary emission start time t0 to shift to S202. In S202, the image correction unit 202 determines whether the preliminary emission flag is set (ON). When the preliminary emission flag is set (Yes), the image correction unit 20 shifts to S203 to perform the preliminary emission process depending on the image signal of the current pixel. When the preliminary emission flag is not set (No), the image correction unit 20 shifts to S207 to reset the preliminary emission flag again without performing the preliminary emission process. This is to start the black pixel determination process in FIG. 7.

In S203, the image correction unit 20 determines whether the image signal value Q of the pixel is 0. When the image signal value Q is 0 (Yes), the image signal value Q is replaced with a minute image signal value Q0 except for 0 to perform preliminary emission (S204). More specifically, the preliminary emission is to embed an image signal such that a current of a minute current value I0 (corresponding to light intensity L0) flows in the semiconductor laser. When the image signal value Q is not 0 in S203 (No), the image correction unit 20 shifts to S205 to emit a beam without changing the image signal Q at current time.

The image correction unit 20 determines whether the time reaches black pixel end time t1 in S206. When the time does not reach the time t1 (No), the image correction unit 20 returns to S203 to the same process as described above to the pixel of the next time. More specifically, in a period from time t0 to time t1, the processes in S204 or 205 is performed, and a preliminary emission signal is embedded in an input image signal. When the time reaches time t1 (Yes), the image correction unit 20 shifts to S207 to reset the preliminary emission flag.

As a method of determining the time t1 in the above description, a method of determining time at which the black pixel period is ended in the black pixel determination process to switch the pixel to a pixel except for a black pixel is employed. However, another method may be used. For example, time at which a pixel in which a value of current flowing in the semiconductor laser is approximate to the threshold current Ith is displayed may be defined as the time t1.

Although the preliminary emission process is determined on the basis of the preliminary emission control signal 27 in the embodiment, another method may be used. For example, after continuous black pixels are detected in the black pixel determination process, preliminary emission is performed when a current value corresponding to an image signal for the next emission is approximate to the threshold current Ith, and, otherwise, the preliminary emission is not performed. In this manner, displays may be dynamically switched depending on input image signals. In the above description, the image correction unit 20 performs the black pixel determination process and the preliminary emission process. However, these processes may be performed at another place. For example, on the downstream side of the line memory 23 in FIG. 2, the black pixel determination process and the preliminary emission process may be performed on the basis of a clock frequency used when an image signal is transmitted to the laser driver 4 side.

The embodiment describes the example in which the black pixel determination process and the preliminary emission process are performed to an image signal to be input. However, the same advantage as described above can also be achieved by processing an input image. More specifically, the input image may be processed such that an optical output of the light intensity L0 is added in a period from time t0 to time t1. In this manner, a processing load on the image correction unit 20 can be reduced.

According to the first embodiment described above, the black pixel determination process of detecting a black pixel duration and the preliminary emission process of adding preliminary emission can make it possible to improve rising response (waveform blunting) of a laser beam. For this reason, a laser projection display device which can suppress a decrease in luminance and irregular color at a boundary portion between bright and dark images to make it possible to display a high-quality image can be provided.

Second Embodiment

In the first embodiment, preliminary emission is continuously performed in the period from time t0 to time t1. However, in the second embodiment, preliminary emission is intermittently performed. When the preliminary emission is intermittently performed, in comparison with the continuously performed preliminary emission, a bright line generated by the preliminary emission is advantageously difficult to be visually recognized.

FIG. 9 is a diagram showing an emission waveform of a semiconductor laser when preliminary emission is added in the second embodiment. This shows a case in which a position indicated by a chain line 45 in FIG. 4B is scanned from the left to the right. The same reference numerals as in the first embodiment denote the same elements in the second embodiment, and repetitive descriptions thereof are avoided.

Preliminary emission 54 of the light intensity L0 is intermittently added in a period from time t0 to time t1. As a result, on a laser beam response waveform 52, the light intensity sharply rises at time t1. In this case, the light intensity L0 is at a level which is ⅟10 or less the light intensity La. In this manner, even in the preliminary emission 54 which is intermittently performed, a current is caused to slightly flow a current in the semiconductor laser through the laser driver 4 to make it possible to reduce an influence of the parasitic capacitance of the switch element, and rising response of a laser beam can be improved.

For this reason, a decrease in luminance and irregular color at the image bright/dark state switching portion (the ends of the white window) can be suppressed. Since the preliminary emission 54 in this case is intermittently operated, an apparent light intensity becomes the light intensity L0 or less, and a bright line generated by preliminary emission is not easily visually observed. In other words, by a decrease in apparent light intensity, the start time t0 of the preliminary emission may be made earlier than that in the first embodiment (FIG. 5B).

Figure 10:
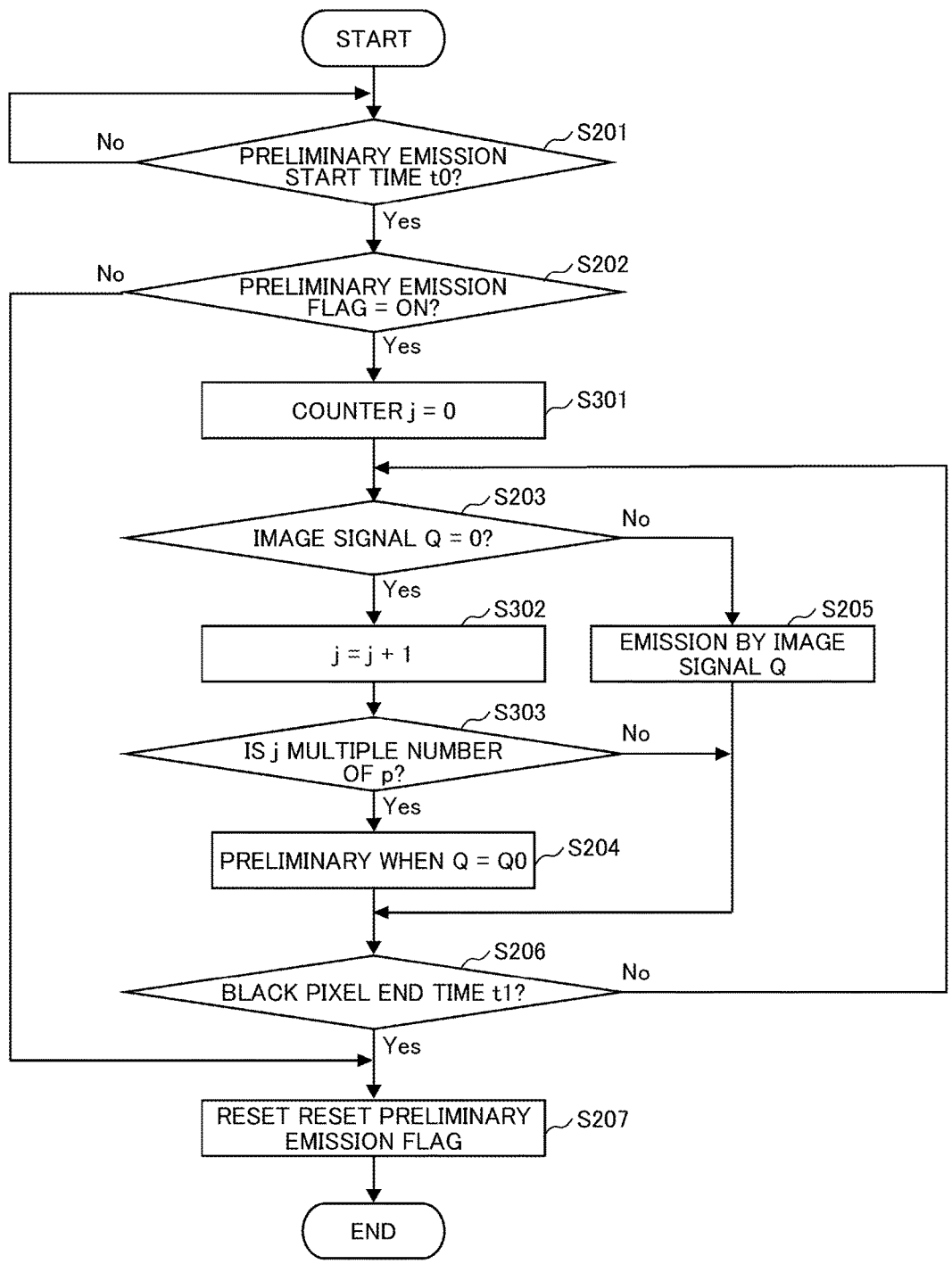
FIG. 10 is a flow chart showing a preliminary emission process (S300) according to a second embodiment.

FIG. 10 is a flow chart showing a preliminary emission process (S300) in the second embodiment. In response to the result of the black pixel determination process in FIG. 7, the image correction unit 20 generates an image signal for intermittent preliminary emission. The same reference numerals as in the first embodiment (FIG. 8) denote the same processes in the second embodiment, and new processes will be described below.

In the determination in S202, the image correction unit 20 shifts to S301 when the preliminary emission flag is set (ON) to reset a counter j. The counter j mentioned here is a pixel number counter for intermittent operation. Thereafter, in S203, a preliminary emission process is performed depending on an image signal of a current pixel. First, the image correction unit 20 determines whether the image signal value Q of the pixel is 0.

When the image signal value Q is 0, the image correction unit 20 increments the counter j in S302 and then determines whether the value of the counter j is a multiple number of a parameter p. The parameter p is an integer given in advance by the preliminary emission control signal 27. When the value of the counter j is a multiple number of the parameter p (Yes), the image correction unit 20 shifts to S204 to replace the image signal value Q with the minute image signal value Q0 except for 0 to perform preliminary emission. When the value of the counter j is not a multiple number of the parameter p (No), the image correction unit 20 shifts to S206 without performing preliminary emission.

As a result, for example, when p=3 is satisfied, preliminary emission is performed at timings at which counter j=0, 3, 6, 9, . . . , and the preliminary emission is not performed at other timing, so that the preliminary emission is intermittently operated in a period the length of which is almost ⅓ the length of the period from time t0 to time t1.

Also in the second embodiment, the preliminary emission process of intermittently adding preliminary emission can improve rising response (waveform blunting) of a laser beam. Since preliminary emission is intermittently operated in the second embodiment, a bright line generated by the preliminary emission is advantageously more difficult to be visually recognized.

Third Embodiment

Each of the first and second embodiments describes the configuration in which preliminary emission is applied to an input image, i.e., a display image. In contrast to this, a third embodiment describes a case in which preliminary emission is applied as emission for monitor. In the laser projection display device, the emission for monitor is performed except for emission for display image. To cope with lack of intensity of a laser beam caused by aged deterioration, a variation in laser beam output caused by a change in temperature of an ambient surrounding, and the like, emission for monitor is performed to give a predetermined white balance to a projection image to optimize emission conditions of the laser beam. In the third embodiment, preliminary emission is added to the emission for monitor.

An adjustment operation of a laser beam by emission for monitor will be described. The monitor emission is performed such that, unlike in an input image, a monitor signal generated inside the laser projection display device 1 is directly given to the laser driver 4. For example, the emission control unit 22 in FIG. 2 gives a signal emitted for monitor to the laser driver 4 to cause a predetermined amount of current to flow in a semiconductor laser so as to perform monitor emission. The optical sensor 10 detects the optical output and causes the amplifier 9 to amplify the optical output. Thereafter, the result is received by the emission control unit 22. The emission control unit 22 detects a relationship between an amount of current and an optical output and controls the current gain circuit 24 and the offset current circuit 25 in the laser driver 4 on the basis of the relationship between the amount of current and the optical output. In this manner, an emission condition of a laser beam is optimized.

FIGS. 11A and 11B are diagrams showing monitor emission and preliminary emission applied to the monitor emission in the third embodiment. FIG. 11A shows a display image, and FIG. 11B shows an emission waveform of a laser beam. In FIG. 11A, reference numeral 60 denotes a display image region, and monitor emission 61 is performed in a region outside the display image region 60. Thus, a bright line is not visually recognized in the monitor emission 61. In FIG. 11B, when the monitor emission 61 of the light intensity La is performed in a period from time t4 to time t5, preliminary emission 62 of the light intensity L0 is added in a period from time t3 to time t4 immediately before the period from time t4 to time t5. As a result, rising response of the waveform of the monitor emission 61 can be improved.

In this embodiment, the emission control unit 22 gives to the laser driver 4 that a duration (t3 to t4) of the preliminary emission 62 with respect to the monitor emission 61 is longer than a duration (t0 to t1) of the preliminary emission 53 with respect to the display image emission 52 shown in FIG. 5B. This is because, since the monitor emission 61 is performed outside the display image region 60, a bright line is not visually recognized even though the duration of the preliminary emission 62 is made long. For this reason, sufficient preliminary emission is given to monitor emission, rising response of the monitor emission is improved, and a relationship between an amount of current and an optical output can be detected more accurately. As a result, a laser projection display device which accurately adjusts emission conditions of a laser beam to make it possible to display a high-quality image can be provided.

What is claimed is:

1. A laser projection display device for projecting a laser beam depending on an image signal to display an image, comprising:
    a laser beam source that generates the laser beam;
    a laser beam source driving unit that drives the laser beam source; and
    an image processing unit that supplies the image signal for display to the laser beam source driving unit, wherein
    the image processing unit, when the image signal has a detected black pixel duration of a black pixel in which a current flowing in the semiconductor laser and in which when compared to an image signal to be displayed comes close to 0, in a predetermined period immediately before a black pixel is switched to a pixel which is not black, is adapted to perform a preliminary emission process applying a preliminary emission signal to the laser beam source driving unit to perform preliminary emission to the image signal, wherein the black pixel determination and the duration of the black uses a flag for setting a preliminary emission flag after the duration of the black pixel continues for a period of units of pixels wherein each black pixel is counted via a counter and compared to set the flag for the preliminary emission period, and the image signal is compared as smaller than a threshold value of a black pixel,
    wherein the image processing unit performs the preliminary emission process during the display of the image, when a maximum light intensity of the laser beam source is operated in a dark image region while being reduced in maximum light intensity to display the image signal; and
    wherein the image processing unit applies, as the preliminary emission signal, a signal corresponding to a light intensity which is 1/10 or less of a maximum light intensity in the dark image region of the laser beam source.

2. The laser projection display device according to claim 1, wherein
    the image processing unit compares a level of the image signal with a threshold value Qth to detect a black pixel, and performs the preliminary emission process when a duration of the detected black pixel is larger than a threshold value Cth.

3. The laser projection display device according to claim 1, wherein
    the image processing unit performs the preliminary emission process when the laser beam source is operated at a threshold current Ith to display the image signal.

4. The laser projection display device according to claim 1, wherein
    the image processing unit applies, as the preliminary emission signal, an intermittent signal which intermittently performs the preliminary emission.

5. The laser projection display device according to claim 1, wherein
    the image processing unit further supplies a monitor emission signal to the laser beam source drive unit and applies a preliminary emission signal to perform preliminary emission in a predetermined period immediately before the monitor emission signal.

6. The laser projection display device according to claim 5, wherein
    a time for which the preliminary emission signal is applied to the monitor emission signal is longer than a time for which the preliminary emission signal is applied to the image signal.

7. A driving method for a laser beam source when a laser beam depending on an image signal is projected to display an image comprising:
    the step of determining whether the image signal has a detected black pixel duration of a black pixel in which a current flowing in the semiconductor laser and in which when compared to an image signal to be displayed comes close to 0;
    the step of, when the image signal has the black pixel duration, in a predetermined period immediately before a black pixel signal is switched to a pixel which is not black, applying a preliminary emission signal to the laser beam source driving unit to perform preliminary emission to the image signal, wherein the black pixel determination and the duration of the black uses a flag for setting a preliminary emission flag after the duration of the black pixel continues for a period of units of pixels wherein each black pixel is counted via a counter and compared to set the flag for the preliminary emission period, and the image signal is compared as smaller than a threshold value of a black pixel; and
    the step of supplying the image signal to which the preliminary emission signal is applied to a laser beam source driving unit, driving the laser beam source with the laser beam driving unit, and generating a laser beam depending on the image signal,
    wherein in the step of applying the preliminary emission signal, the preliminary emission signal is applied during the display of the image, when a maximum light intensity of the laser beam source is operated in a dark image region while being reduced in maximum light intensity to display the image signal; and as the preliminary emission signal, a signal corresponding to a light intensity which is 1/10 of less of a maximum light intensity in the dark image region of the laser beam source is applied.

8. The driving method for a laser beam source according to claim 7, wherein
    in the step of applying the preliminary emission signal, a level of the image signal is compared with a threshold value Qth to detect a black pixel, and the preliminary emission process is performed when a duration of the detected black pixel is larger than a threshold value Cth.

9. The driving method for a laser beam source according to claim 7, wherein
    in the step of applying the preliminary emission signal, the preliminary emission signal is applied when the laser beam source is operated at a threshold current Ith to display the image signal.

* * * * *